United States Patent
Lu et al.

(10) Patent No.: US 7,412,774 B2
(45) Date of Patent: Aug. 19, 2008

(54) LASER LEVEL WITH SELECTABLE CONSTANT OR PULSED BEAM OUTPUT

(75) Inventors: Jianhong Lu, Jiaangsu (CN); Minli Zhang, Jiaangsu (CN); Yifei Xu, Jiaangsu (CN)

(73) Assignee: Johnson Level & Tool Mfg. Co., Inc., Mequon, WI (US)

( * ) Notice: Subject to any disclaimer, the term of this patent is extended or adjusted under 35 U.S.C. 154(b) by 164 days.

(21) Appl. No.: 11/274,868

(22) Filed: Nov. 15, 2005

(65) Prior Publication Data

US 2006/0280212 A1    Dec. 14, 2006

(51) Int. Cl.
*G01C 15/00* (2006.01)
*G01C 5/00* (2006.01)

(52) U.S. Cl. .................. 33/290; 33/286; 33/DIG. 21

(58) Field of Classification Search .................. 33/290, 33/286, 291, 293, 285, DIG. 21
See application file for complete search history.

(56) References Cited

U.S. PATENT DOCUMENTS

| 5,144,486 | A | | 9/1992 | Hart | |
|---|---|---|---|---|---|
| 5,287,627 | A | * | 2/1994 | Rando | 33/227 |
| 5,782,003 | A | * | 7/1998 | Bozzo | 33/291 |
| 5,819,424 | A | | 10/1998 | Ohtomo et al. | |
| 5,838,431 | A | | 11/1998 | Hara et al. | |
| 6,796,040 | B2 | | 9/2004 | Ohtomo et al. | |
| 2007/0091943 | A1 | * | 4/2007 | Brocklin et al. | 372/21 |
| 2008/0077200 | A1 | * | 3/2008 | Bendett et al. | 607/89 |
| 2008/0086043 | A1 | * | 4/2008 | Heller et al. | 600/347 |

\* cited by examiner

*Primary Examiner*—Yaritza Guadalupe-Mccall
(74) *Attorney, Agent, or Firm*—Boyle Fredrickson, S.C.

(57) ABSTRACT

A laser marking device including an oscillating mechanism that enables the laser beams emitted from the device to be emitted in either a constant state or in a pulsed state to enhance the visibility of the laser beam in various lighting conditions. The oscillating mechanism modulates the power supplied by the power source into either a constant state or a pulsed state in order to send the power in that state to the laser generator, which consequently emits a laser beam in either a constant or pulsed state. In bright light conditions in which the beam is not readily visible, the beam can be emitted in a pulsed state to be sensed by a separate detector capable of detecting the pulsed beam from the device. The detector provides an indication to the operator of the position of the beam relative to the detector such that the operator can readily determine the location of the beam.

19 Claims, 3 Drawing Sheets

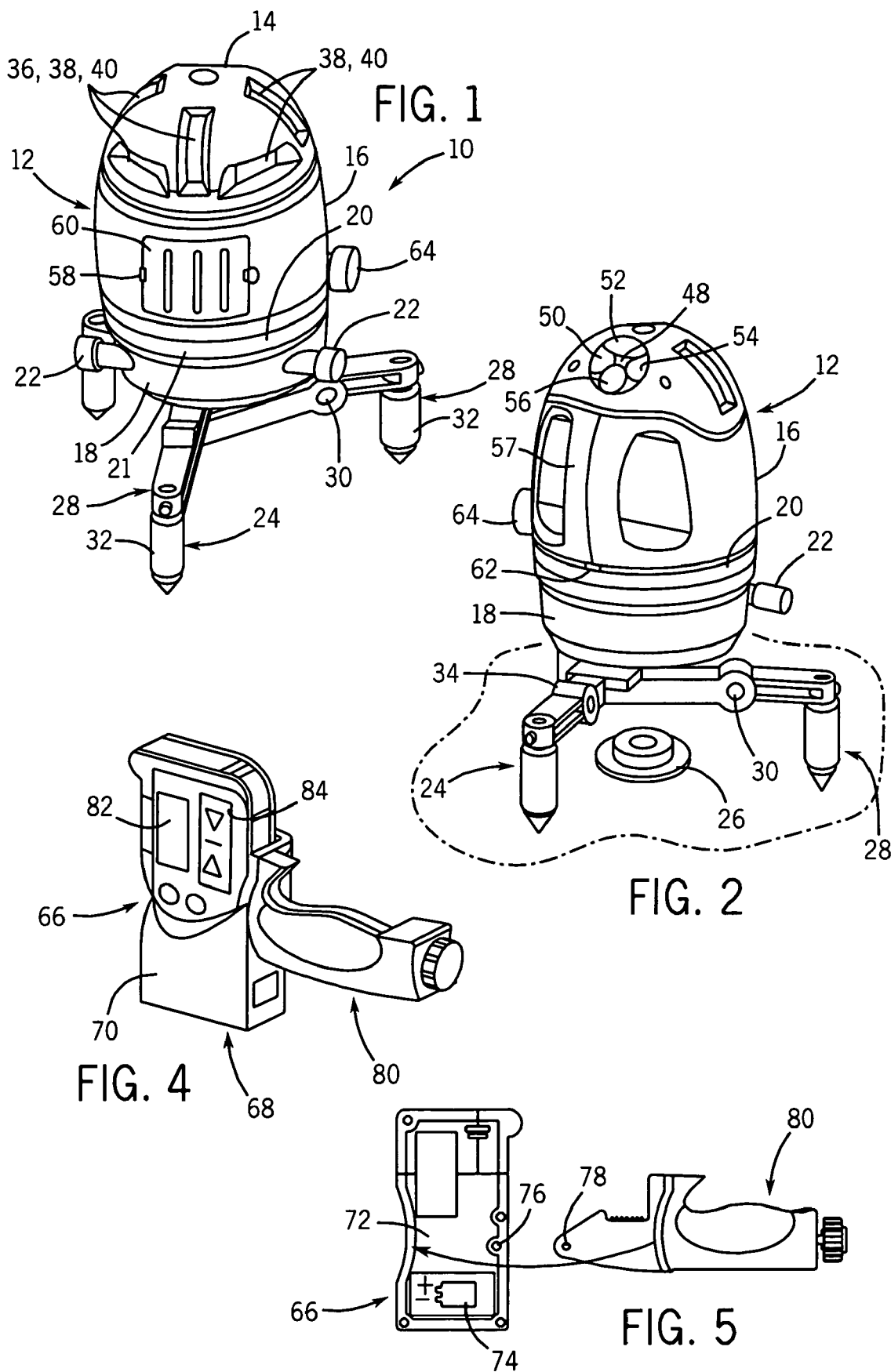

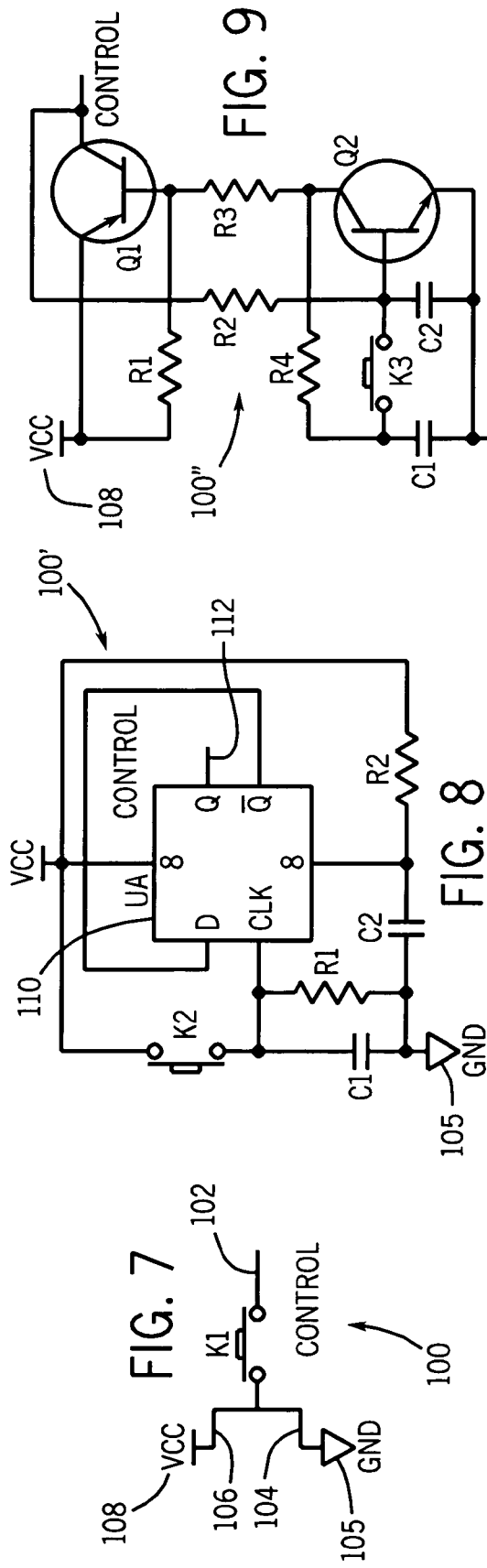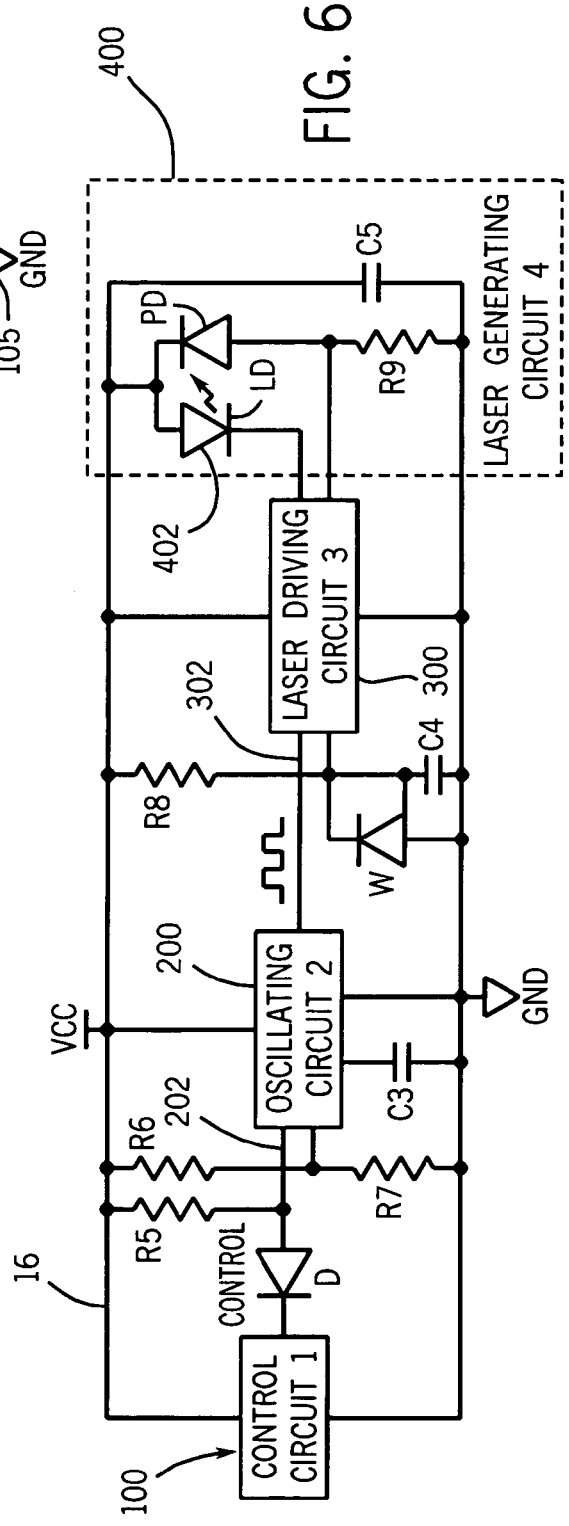

LASER LEVEL WITH SELECTABLE CONSTANT OR PULSED BEAM OUTPUT

CROSS-REFERENCE TO RELATED APPLICATIONS

This application claims priority from Chinese Patent Application Publication No. 200520072421.1, filed Jun. 8, 2005.

FIELD OF THE INVENTION

The present invention relates generally to laser levels, and more particularly to a laser level including a switch operable to change the mode of operation of the laser generator from a constant beam output to a pulsed beam output.

BACKGROUND OF THE INVENTION

At present, a large number of line laser products i.e. laser markers or levels, are used in the fields of construction and home remodeling. As a tool used to generate a horizontal base line and vertical base line, laser markers of this type are widely applied in construction fieldwork as a result of their ability to generate a bright line, which is both easily visible and affords higher precision than other measuring or marking devices. Many applications of laser markers of this type use a laser sensor or detector, which typically senses the presence of the beam output by the laser marker and provides a signal (typically an audible and/or a visual signal) in response to detection of the laser beam.

With known laser markers, the emitted laser line power signal is constant, which makes it difficult to observe the laser line over even a short distance with the naked eye, especially in bright sunlight conditions. In addition, bright sunlight conditions can prevent the laser sensor or detector from sensing the laser beam emitted by the laser marker. Thus, in actual application, a stronger power laser generator is required to enhance the brightness of the laser line such that it is more capable of being observed or sensed when in operation. However, this also causes an increase in the cost of constructing and using the marker. Further, even if a stronger power laser generator is used, it can still be difficult to observe the laser line with the naked eye in bright sunlight, or to sense the laser line with the sensor, unless the observer or sensor is located a very short distance from the marker. Therefore, increasing the power of the laser generator cannot rectify the problems with line visibility or sensing in markers of this type.

SUMMARY OF THE INVENTION

It is a primary aspect of the present invention to provide a laser marker device that can switch the mode of operation of the device according to the surrounding light conditions in which the device is to be used. To achieve this purpose, the laser marker device includes a laser driving circuit, and a laser irradiating circuit that is connected with the driving power source output end of the laser driving circuit. The laser irradiating circuit also includes a control circuit and an oscillating circuit that can modulate power signals coming from the control circuit. The control circuit of the present invention can take a variety of different forms, e.g., the power source switch, or a D trigger, or two triodes, with each form having a simple structure and correspondingly low cost. The control signal output end of the control circuit is connected with the control signal input end of the oscillating circuit, and the oscillating signal output end of the oscillating circuit is connected with the oscillating signal input end of the laser driving circuit. In this manner, the mode of operation of the laser driving circuit is switchable between a low electronic level, constant output state and a high electronic level, pulsed output state according to the signals transmitted from the oscillating circuit. Using this configuration, the laser marking device of present invention allows the laser signals to be switched in either a low illumination environment, e.g., indoors, or in a bright sunlight environment, such that only a lower power laser generator is required for the device to be capable of producing a visible laser line in both types of environments, which saves electric power and reduces the cost for the device.

According to another aspect of the present invention, the laser marker includes an external switch on the housing for the maker device. The switch is operable to select between a first position in which the output of the device is selected to be a constant output, and a second position in which the output of the device is selected to be a pulsed output.

Numerous other aspects, features and advantages of the present invention will be made apparent from the following detailed description taken together with the drawing figures.

BRIEF DESCRIPTION OF THE DRAWINGS

The drawings illustrate the best mode currently contemplated of practicing the present invention.

In the drawings:

FIG. 1 is an isometric view of a laser marking device constructed according to the present invention;

FIG. 2 is an isometric view of the laser marking device of FIG. 1 from another angle;

FIG. 4 is an isometric view of a sensor or detector and associated handle used with the device of FIG. 1;

FIG. 5 is a front elevation view of the sensor or detector of FIG. 4;

FIG. 6 schematic view of the electronic circuit of the laser marking device of FIG. 1;

FIG. 7 is a schematic view of a first embodiment of the control circuit portion of the electronic circuit of FIG. 6;

FIG. 8 is a schematic view of a second embodiment of the control circuit portion of FIG. 6; and FIG. 9 is a schematic view of a third embodiment of the control circuit portion of FIG. 7.

DETAILED DESCRIPTION OF THE INVENTION

Figure 3:
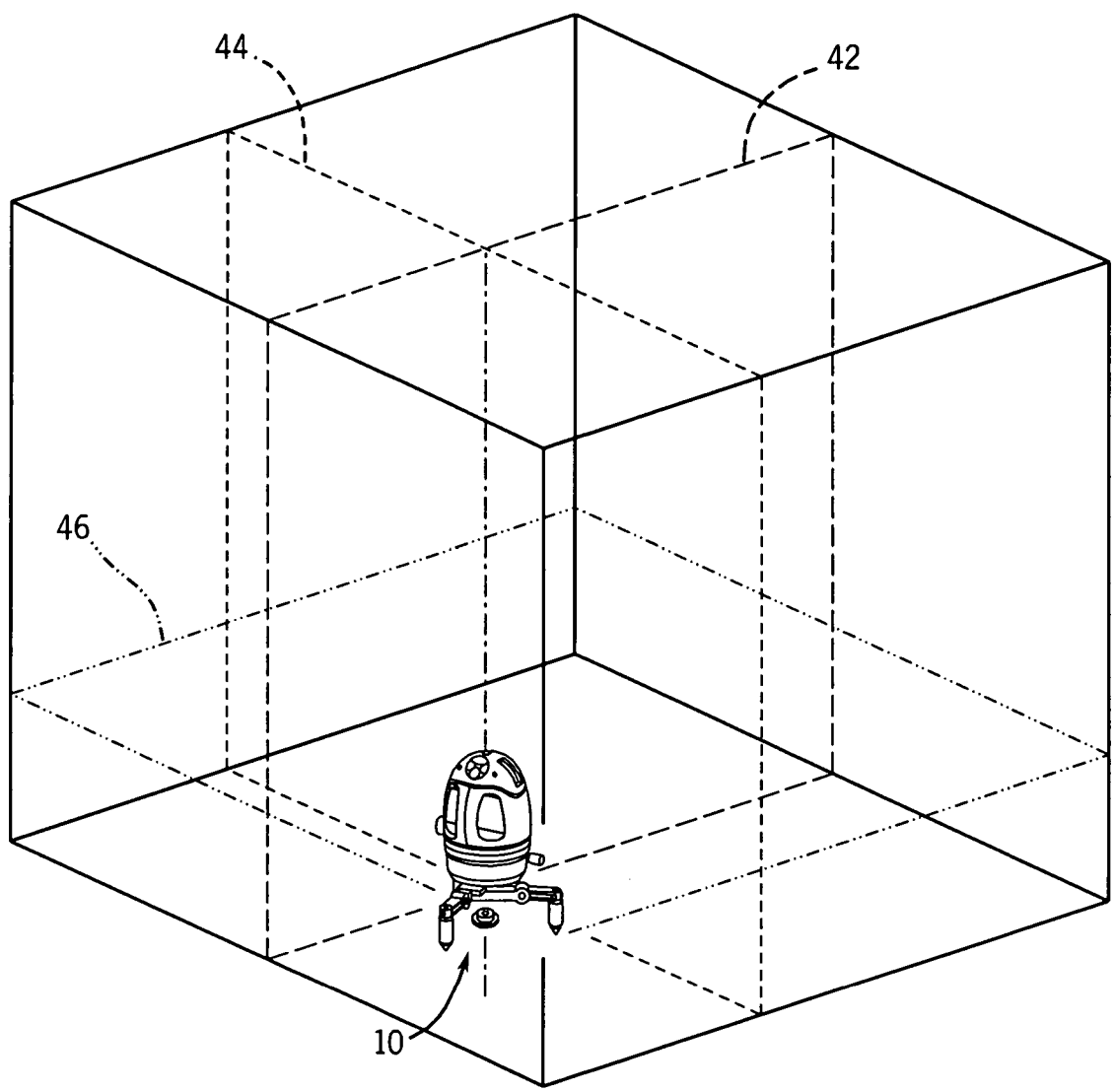
FIG. 3 is a schematic view of the operation of the laser marking device of FIG. 1.

With reference now to the drawing figures in which like reference numerals designate like parts throughout the disclosure, a laser marking device constructed according to the present invention is indicated generally at 10 in FIG. 1. The device 10 includes a housing 12 that has an upper portion 14, a middle portion 16 and a lower portion 18.

The lower portion 18 is separated from the middle portion 16 by a rotatable angle dial 20. The angle dial 20 enables the middle portion 16 to be rotated with respect to the lower portion 18 in order to enable a user of the device 10 to direct the beams from the device 10 at a desired angle with regard to the target, as indicated by the angle marker 21 on the device 10. The rotation of the middle portion 16 can be accomplished by simply grasping and moving the middle portion 16 relative to the lower portion 18, or by using one of a pair of fine adjusting screws 22 extending outwardly from the lower portion 18.

The lower portion 18 also is connectable to a tripod base 24 in order to support the device 10 level over an uneven surface (not shown). The tripod 24 includes a connector 26 that functions to releasably engage the tripod 24 to the lower portion 18 of the device 10. The tripod 24 also includes three individually adjustable legs 28 extending outwardly from the tripod 24. Each leg 28 is connected by a pivot pin 30 in order to enable each leg 28 to pivot with respect to the tripod 24. Also, each leg 28 includes an adjustment screw 32 that can be rotated to extend or shorten the leg 28 when leveling the device 10. After the tripod 24 has been adjusted to level the device 10 as indicated by one or more bubble levels (not shown) disposed on the device 10, a locking staff 34 can be engaged to secure the tripod 24 in the adjusted position, such the tripod 24 is locked in that position. When it is desired to readjust the tripod 24 and re-level the device 10, the locking staff 34 can be unlocked, such that the tripod 24 and the legs 28 can again be adjusted.

The upper portion 14 is generally dome shaped, and includes a number of windows 36, 38 and 40. The upper portion 14 encloses a laser generator (not shown) that, when operated, generates a laser beam (not shown). The generator is disposed within the upper portion 14 on a self-leveling platform (not shown) that enables the generator to continually generate a level laser beam. The beam from the generator passes through one or more prisms (not shown) disposed adjacent the laser generator to split the beam into a number of reference beams or lines 42-46 that pass through the windows 36-40 in the upper portion 14, as best shown in FIG. 3. The window 36 is disposed along a vertical centerline of the device 10 and can emit a laser beam to form a first vertical reference line 42. The windows 38 are disposed on opposite sides of the window 36, each oriented approximately ninety (90) degrees with respect to the window 36 and directly opposite one another, and each emits a laser beam to form a second vertical line 44. The windows 40 are disposed in a generally horizontal plane and are located between the window 36 and each of the windows 38. The windows 40 emit a laser beam that forms a horizontal line 46 that intersects both of the vertical reference lines 42,44.

Opposite the window 36, the upper portion 14 includes an operating panel 48. The operating panel 48 includes a number of buttons 50-54 that are used to activate and deactivate the reference lines 42-46, respectively. The panel 48 also includes a button 56 that is used to switch the mode of operation of the laser generator between a constant mode and a pulsed mode, in a manner to be described.

The middle portion 16 houses the operating components of the device 10 that are connected to the laser generator. The middle portion 16 includes a handle 57 on one side that can be used to grasp and move the device 10 where desired. Opposite the handle 57, the middle portion 16 includes a battery housing 58 with a removable cover 60 that can hold a number of batteries (not shown) to provide power to the device 10. The middle portion 16 also includes a DC outlet 62 opposite the battery housing 58 that can be used as an alternative power supply for the device 10. The power supply for the device 10, whether supplied by the batteries or the DC power, is selectively connected to the laser generator by the operation of a locking knob 64 disposed on the middle portion 16. The locking knob 64 can be rotated on the middle portion to supply power to the laser generator and to unlock the self-leveling platform on which the generator is disposed. When the knob 64 is rotated back to the locked position, the platform is locked in an immovable position, and the power to the laser generator is interrupted.

In conditions in which it is difficult to view the lines 42-46, and particularly when the laser generator is operated in the pulsed mode, the device 10 can be used with a sensor or detector 66. The detector 66, as best shown in FIGS. 4 and 5, includes a housing 68 with a front panel 70 and a rear panel 72. The rear panel 72 includes a battery housing 74 for holding a battery (not shown) and a threaded bore 76. The bore 76 is adapted to receive and engage a bolt 78 disposed in one end of a handle 80. The engagement of the bolt 78 within the bore 76 enables the handle 80 to be secured to the housing 68. The front panel 70 includes a detection screen 82 and an indicator screen 84. The detector screen 82 can sense the constant or pulsed laser beam emitted from the laser generator. Based on the portion of the detector screen 82 that senses the beam, the indicator screen 84 will illustrate whether the beam is below, at or above a centerline of the detector 66. When the detector 66 is operated with the handle 80, the detector 66 can also be used to determine whether the beam is to the left or right of a centerline of the detector 66.

Referring now to FIG. 6, the internal workings of the laser marking device 10 are schematically illustrated. Particularly, the device 10 includes a control circuit 100, an oscillating circuit 200 that can produce modulation signals, a laser driving circuit 300 and a laser irradiating circuit 400 that is connected with a driving power source output end 302 of the laser driving circuit 300.

Looking now at FIGS. 6 and 7, the control circuit 100 in a first embodiment is constructed as a power source switch K1. Leg or output end 102 of the power source switch K1 is the control signal output end of said control circuit 100, leg 104 of the power source switch K1 is connected to the ground 105, and leg 106 is connected to the power source 108, i.e., the battery housing 58 or the DC outlet 62.

In a second embodiment shown in FIG. 8, the control circuit 100' can also comprise a button-igniting circuit 110 and a D igniter or trigger UA. The second embodiment of the control circuit 100' comprises the button-trigger circuit and an trigger UA, and the control signal output end of the button-trigger circuit is connected with the control signal input end of D trigger UA, and the output end of the D trigger UA is the control signal output end of the control circuit. More specifically, the button-igniting circuit 110 comprises a button K2, a pair of resistors R1 and R2 and a pair of capacitors C1 and C2. When the button K2 is depressed, the capacitor C1 can filter the waves from the power source and eliminate dithering. Further, the end 112 of the D igniter UA functions as the control signal output end 102 of the control circuit 110.

Additionally, in a third embodiment of the control circuit 100" shown in FIG. 9, the control circuit 100" can comprise a button K3, two triodes Q1 and Q2, four resistors R1 and R2 and R3 and R4, and two capacitors C1 and C2. In this embodiment, the emitting electrode of the triode Q1 is connected with the power source 108, and the resistor R1 is connected in parallel between the collector electrode and the base electrode of the triode Q1. The resistor R2 is serially connected between the collector electrode and the base electrode of the triode Q1, and the emitting electrode of the triode Q2 is connected to the ground 105. The capacitor C2 is connected in parallel between the base electrode and the emitting electrode of the triode Q2, and the collector electrode of the triode Q2 is serially connected with the resistor R3 and then connected with the base electrode of the triode Q1. Further, one end of the button K3 is connected with the base electrode of the triode Q2 and the other end of the button K3 is serially connected with the capacitor C1 and then the ground 105. Also, one end of the resistor R4 is connected with the collector electrode of the triode Q2 and the other end is serially connected with the capacitor C1. The collector electrode of the triode Q1 is the control signal output end 102 of this embodiment of the control circuit 100".

Looking again at FIG. 6, between the control circuit 100 and the oscillating circuit 200, the device 10 includes a commutation diode D, a wave filtered capacitor C3 and resistors R5, R6, R7. The control signal output end 102 of the control circuit 100 is connected with the cathode of the commutation diode D, and the anode of the commutation diode D is connected with the control signal input end 202 of the oscillating circuit 200. The pulling resistor R5 is also connected with the control signal input end 202 of the oscillating circuit 200. The resistors R6 and R7 are serially connected between the ground 105 and the power source 108, and their joint 204 is connected with reference voltage end 206 of the oscillating circuit 200.

The oscillating signal output end 208 of the oscillating circuit 200 is connected with the oscillating signal input end 302 of the laser driving circuit 300. Further, the resistor R8, the capacitor C4 and the constant voltage diode W form a reference power source circuit 400 that is peripheral equipment for the laser driving circuit 300.

The laser irradiating circuit 400 is constructed from a laser diode 402, a resistor R9 and a capacitor CS. The laser irradiating circuit 400 is configured to work in either a constant laser line power state or a pulsed laser line power state. More particularly, according to the constant-voltage signals transmitted from the oscillating circuit 200, it is possible for the laser driving circuit 300 to drive or supply power to the laser irradiating circuit 400 in a constant laser line power state and provide a constantly irradiated laser line. Additionally, according to the modulation signals that can be transmitted from the oscillating circuit 200 it is also possible to supply power to the laser irradiating circuit 400 in a pulsed laser line power pulse state and provide a modulated irradiated laser line.

Therefore, when the laser marking device 10 of the present invention is utilized in low-light conditions, e.g. when used indoors, the user can select the electromotive force of the control signal output end 102 of the control circuit 100 to be set at low electronic level, which consequently makes the electromotive force of the oscillating signal output end 202 of the oscillating circuit 200 stay constant, and correspondingly drive the laser irradiating circuit 400 in a constant power state and provide a constant laser line, such that the user can observe the position of the laser line or lines with the naked eye. Alternatively, when the laser marking device 10 of the present invention is utilized in highly illuminated surroundings, e.g., outdoors in bright sunlight conditions, the user can keep the electromotive force of the control signal output end 102 of the control circuit 100 at a high electronic level, which can make the oscillating signal output end 202 of the oscillating circuit 200 transmit a modulated, pulsed signal. According to this modulated, pulsed signal, the laser irradiating circuit 300 can be driven in a pulsed power state to provide a pulsed laser line, the particular location of which can be observed via the line laser detector 66.

Various alternatives are contemplated as being within the scope of the following claims, particularly pointing out and distinctly claiming the subject matter regarded as the invention.

We hereby claim:

1. A laser marking device comprising:
a) a power source for providing power;
b) a laser generator operably connected to the power source for emitting a laser beam from the device;
c) an oscillating device operably connected between the power source and the laser generator, the oscillating device capable of modulating a state of the power provided by the power source; and
(d) a control device operably connected between the power source and the oscillating device, wherein the control device is configured and arranged to interact with the power source and the oscillating device to selectively modulate the state of the power from the power source between a constant power state for providing a constant laser beam from the laser generator, and a pulsed power state for providing a pulsed laser beam from the laser generator.

2. The device of claim 1 wherein the control device comprises a switch operably connected to the oscillating device and capable of changing the operation of the oscillating device.

3. The device of claim 2 wherein the switch is capable of switching the operation of the oscillating device between the modulation of the power to the constant power source state and the modulation of the power to the pulsed power state.

4. The device of claim 2 wherein the switch is a manually operable switch.

5. The device of claim 1 wherein the laser generator comprises:
a) a laser driving circuit operably connected to the oscillating device; and
b) a laser irradiating circuit operably connected to the laser driving circuit and operable to generate the laser beam.

6. The device of claim 1 wherein the control device comprises a power switch operable to selectively connect the power source and the oscillating device.

7. The device of claim 6 wherein the control device further includes an igniter.

8. The device of claim 6 wherein the control device further comprises at least one triode.

9. The device of claim 1 further comprising a detector capable of sensing the laser beam generated when the oscillating device is operating to modulate the power to a pulsed power state.

10. The device of claim 9 wherein the detector comprises:
a) a housing;
b) a detector disposed on the housing; and
c) an indicator disposed on the housing and operably connected to the detector.

11. The device of claim 10 wherein the detector is disposed within an aperture in the housing.

12. The device of claim 10 further comprising a handle releasably connected to the housing.

13. The device of claim 12 wherein the housing comprises a front panel and a rear panel.

14. The device of claim 13 wherein the rear panel includes a threaded bore adapted to receive and engage a bolt disposed in one end of the handle thereby enabling the handle to be secured to the housing.

15. The device of claim 10 wherein the indicator comprises an indicator screen configured to visually illustrate whether the laser beam is one of below, at and above a centerline of the detector.

16. The device of claim 15 wherein the device is configured so that when the detector is operated with the handle, the detector can be used to determine whether the laser beam is to the left or right of a centerline of the detector.

17. The device of claim 1 wherein the laser beam emitted by the laser generator forms at least one laser line.

18. The device of claim 1 wherein the control device comprises a control signal output and the oscillating device comprises a control signal input, wherein the control signal output of the control device is operably connected with the control signal input of the oscillating device.

19. The device of claim 18 wherein the oscillating device comprises a control signal output and the laser generator comprises a control signal input, wherein the control signal output of the oscillating device is operably connected to the control signal input of the laser generator.

* * * * *